(12) United States Patent
Han et al.

(10) Patent No.: US 7,994,526 B2
(45) Date of Patent: Aug. 9, 2011

(54) LIGHT EMITTING DIODE PACKAGE AND LIGHT EMITTING DIODE SYSTEM HAVING AT LEAST TWO HEAT SINKS

(75) Inventors: Kwan Young Han, Seoul (KR); Kwang Il Park, Seoul (KR); Jae Ho Cho, Seoul (KR); Jung Hoo Seo, Seoul (KR); Seong Ryeol Ryu, Gyeonggi-do (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 10/557,820

(22) PCT Filed: May 14, 2004

(86) PCT No.: PCT/KR2004/001153
§ 371 (c)(1),
(2), (4) Date: Nov. 23, 2005

(87) PCT Pub. No.: WO2004/107461
PCT Pub. Date: Dec. 9, 2004

(65) Prior Publication Data
US 2007/0063321 A1    Mar. 22, 2007

(30) Foreign Application Priority Data

May 28, 2003   (KR) .................... 10-2003-0033989
Sep. 30, 2003  (KR) .................... 10-2003-0067949

(51) Int. Cl.
*H01L 33/00* (2010.01)
(52) U.S. Cl. ............... 257/98; 257/99; 438/22; 438/25
(58) Field of Classification Search ............ 257/676, 257/98–100
See application file for complete search history.

(56) References Cited

U.S. PATENT DOCUMENTS

| 4,126,882 A  | * | 11/1978 | Carson et al. ............ 257/697 |
| 5,748,658 A  |   | 5/1998  | Nakanishi et al. |
| 6,204,523 B1 |   | 3/2001  | Carey et al. |
| 6,274,924 B1 | * | 8/2001  | Carey et al. ............ 257/676 |

(Continued)

FOREIGN PATENT DOCUMENTS

JP    1990-008070    1/1990

(Continued)

OTHER PUBLICATIONS

Japanese Office Action dated Sep. 28, 2010 on JP Application No. 2006-532044, which corresponds to U.S. Appl. No. 10/557,820.

(Continued)

*Primary Examiner* — Quoc D Hoang
*Assistant Examiner* — Tony Tran
(74) *Attorney, Agent, or Firm* — H.C. Park & Associates, PLC

(57) ABSTRACT

There is provided a light emitting diode package having at least two heat sinks. The light emitting diode package includes a main body, at least two lead terminals fixed to the main body, and at least two heat sinks of electrically and thermally conductive materials, the heat sinks being fixed to the main body. The at least two heat sinks are separated from each other. Thus, high luminous power can be obtained mounting a plurality of light emitting diode dies in one LED package. Further, it is possible to embody polychromatic lights mounting LED dies emitting different wavelengths of light each other in the LED package.

18 Claims, 6 Drawing Sheets

U.S. PATENT DOCUMENTS

| | | | |
|---|---|---|---|
| 6,335,548 B1 * | 1/2002 | Roberts et al. | 257/98 |
| 6,590,343 B2 * | 7/2003 | Pederson | 315/76 |
| 2002/0149314 A1 * | 10/2002 | Takahashi et al. | 313/500 |
| 2005/0001562 A1 * | 1/2005 | Pederson | 315/291 |

FOREIGN PATENT DOCUMENTS

| | | |
|---|---|---|
| JP | 02-254783 | 10/1990 |
| JP | 06-208335 | 7/1994 |
| JP | 06-232456 | 8/1994 |
| JP | 11-145519 | 5/1999 |
| JP | 11-298050 | 10/1999 |
| JP | 2000-150967 | 5/2000 |
| JP | 3072840 | 8/2000 |
| JP | 2000-244022 A | 9/2000 |
| JP | 2001-036154 | 2/2001 |
| JP | 2001-185763 | 7/2001 |
| JP | 2003-017753 | 1/2003 |
| JP | 2004-521506 | 7/2004 |
| KR | 2001-0114224 | 12/2001 |
| WO | 02/084749 | 10/2002 |

OTHER PUBLICATIONS

International Search Report issued in corresponding International Application No. PTC/KR2004/001153, dated Sep. 7, 2004.

* cited by examiner

LIGHT EMITTING DIODE PACKAGE AND LIGHT EMITTING DIODE SYSTEM HAVING AT LEAST TWO HEAT SINKS

TECHNICAL FIELD

The present invention relates to a light emitting diode package and a light emitting diode system, and more particularly, to a high power light emitting diode package using a light emitting diode die as a light source, and a light emitting diode system having the high power light emitting diode package.

BACKGROUND ART

Recently, it is on the rise to use a light emitting diode (LED) as a light source. More than several thousands lumina of luminous power are, generally, required to use the light emitting diode as a light source for specific applications such as illumination. The luminous power of the light emitting diode is substantially proportional to input power. Therefore, high luminous power is obtained by increasing the electric power inputted to the light emitting diode. However, the increase of the input power raises also the junction temperature of the light emitting diode. The increase of the junction temperature of the light emitting diode causes the loss of photometric efficiency which represents the conversion rate of input energy into visible light. As a result, power consumption increases considerably. Therefore, it is required to prevent the increase of the junction temperature of the light emitting diode due to the increase of input power. For the purpose, it is proposed a light emitting diode package in which the light emitting diode is attached on a heat sink, and the heat generated from the light emitting diode is dissipated through the heat sink.

The light emitting diode package (hereinafter, LED package) employing the heat sink is disclosed in U.S. Pat. No. 6,274,924 B1, entitled "Surface Mountable LED Package" from Carey et al.

FIG. 1 is a perspective view illustrating the LED package 100 disclosed in the U.S. Pat. No. 6,274,924 B1.

Referring to FIG. 1, a heat sink 103 is placed into an insert-molded lead frame 101. The lead frame 101 is a plastic material molded around a metal frame. The heat sink 103 may include a reflector cup 113. A light emitting diode (LED) die 105 is mounted directly or indirectly via a thermally conducting submount 109 to the heat sink 103. Bonding wires (not shown) extend to the metal lead terminals 111 on the lead frame 101 from the LED die 105 and the submount 109. The lead frame 101 is electrically and thermally isolated from the heat sink 103. In addition, an optical lens 107 may be added to the package.

As a result, the LED die 105 is maintained at a low junction temperature because the LED die 105 is thermally coupled on the heat sink 103. Therefore, it is possible to obtain high luminous power since relatively high input power can be supplied to the LED die 105.

However, using only one LED die limits the increase of the luminous power. To overcome such a limitation, it is necessary for a plurality of LED dies to be mounted in one LED package. However, mounting a plurality of LED dies to one heat sink 103 limits an electrical connecting scheme. That is, the electrical connecting scheme of the plurality of LED dies with the heat sink 103 and the lead terminals is limited. Further, in order to assure uniformity of emitted light, it is necessary for the plurality of LED dies, which have the same structure and emit the same wavelength of light, to be mounted on the LED package. However, in the case that the plurality of LED dies, which have the same structure and emit the same wavelength of light, are mounted on one heat sink 103, the input current for driving the LED dies considerably increases since all the LED dies are connected in parallel.

An additional submount may be used for preventing the increase of the input current and emitting uniform light. However, use of the submount complicates fabrication processes of the LED package and increases manufacturing cost thereof.

Meantime, it is required to provide a high power LED package capable of embodying polychromatic lights adapted to meet a variety of applications. An LED die, generally, emits a single wavelength of light. Therefore, LED dies emitting a variety of wavelengths of light should be mounted in one LED package in order to embody the polychromatic lights. Also, the LED dies emitting the various wavelengths of light should be driven respectively. For the purpose, it is needed to control the power supplied to each of the LED dies.

DISCLOSURE OF THE INVENTION

Therefore, an object of the present invention is to provide an LED package in which a plurality of LED dies are mounted and which can secure high luminous power, without a submount.

It is another object of this invention to provide an LED package capable of mounting LED dies having the same structure and emitting the same wavelength of light, and capable of emitting uniform light.

It is a further object of this invention to provide a high power LED package capable of embodying polychromatic lights.

It is still another object of this invention to provide a high power LED system capable of embodying polychromatic lights.

In order to achieve the above objects, an embodiment of the present invention provides an LED package having at least two heat sinks. The LED package according to the embodiment of the present invention comprises a main body, at least two lead terminals fixed to the main body, and at least two heat sinks of electrically and thermally conductive materials. The at least two heat sinks are separated from each other and fixed to the main body. Thus, at least one LED die can be mounted on upper surfaces of the at least two heat sinks. As a result, a plurality of LED dies can be mounted in one LED package, thereby making sure of high luminous power.

The main body may be formed of a thermoplastic material using a injection molding technique. And, the main body may be formed along with the lead terminals and the heat sinks in a single body using a insert molding technique.

Each of the at least two heat sinks may also have a reflective surface extended from the upper surface thereof. The at least two heat sinks having the reflective surfaces are appropriately arranged to reflect the light emitted from the LED die out of the LED package. As a result, the luminous power emitted toward specific direction is increased.

According to another embodiment of the present invention, the at least two lead terminals comprise a pair of lead terminals to be electrically connected to an external power source. Further, the at least two heat sinks may be a pair of heat sinks. At least one LED die is mounted on upper surfaces of the at least two heat sinks. The at least one LED die is electrically and directly connected to the heat sinks via a surface of the die. The LED dies may be arranged such that at least one LED die is located on each of the at least two heat sinks. In addition, a lens attached to the main body encloses the at least one LED die. Further, the lens may include an optically transparent material contacted with the at least one LED die. The optically transparent material may be an optically transparent epoxy or silicone. The optically transparent material protects the at least one LED die. The optically transparent material may contain a light diffusing material.

Meantime, a fluorescent material converting the wavelength of light emitted from the at least one LED die, may be distributed over the at least one LED die. The fluorescent material may be distributed directly on the at least one LED die, or distributed within the optically transparent material. Thus, it is possible to change the light emitted from the at least one LED die into another light having predetermined wavelengths, in particular, white light.

In addition, bonding wires may electrically connect the at least two lead terminals, the at least two heat sinks and the at least one LED die. Then, the at least one LED die is electrically and directly connected to at least one of the bonding wires through another surface of the LED die. As a result, the at least one LED die is electrically connected to the at least one bonding wire and the heat sink to which the die is mounted. Thus, as a power source is coupled to the at least two lead terminals, the electric power can be supplied to the at least one LED die.

According to another embodiment of the present invention, at least one LED die is located on each of the at least two heat sinks. The LED dies comprise LED dies emitting different wavelengths of light each other.

Further, the lead terminals may include lead terminals electrically connected to the at least two heat sinks respectively, and a common lead terminal electrically connected to all of the at least two heat sinks. Accordingly, it is possible for power sources to be placed between the common lead terminal and each of the lead terminals which are electrically connected to the at least two heat sinks respectively. Thus, the LED dies mounted on the at least two heat sinks can be separately driven by turning on or off the respective power sources. Thus, it is possible to embody polychromatic lights.

Further, the LED dies may include LED dies emitting a first wavelength of light, a second wavelength of light and a third wavelength of light, respectively. The first, the second and the third wavelengths may be red, green and blue wavelengths, respectively. Thus, it is possible to embody seven colors of light by turning on or off the respective power sources connected to the LED dies. Further, by controlling the power inputted to each of the LED dies, instead of turning on or off the power source, it is possible to embody even more colors of light.

Meantime, an additional heat sink may be arranged along with the at least two heat sinks. A zener diode is mounted on the additional heat sink. The zener diode allows the LED package to be maintained in a constant voltage, thereby protecting the LED package from static electricity or over current.

BRIEF DESCRIPTION OF THE DRAWINGS

The above objects, other features and advantages of the present invention will become more apparent by describing the preferred embodiment thereof with reference to the accompanying drawings, in which.

Figure 1:
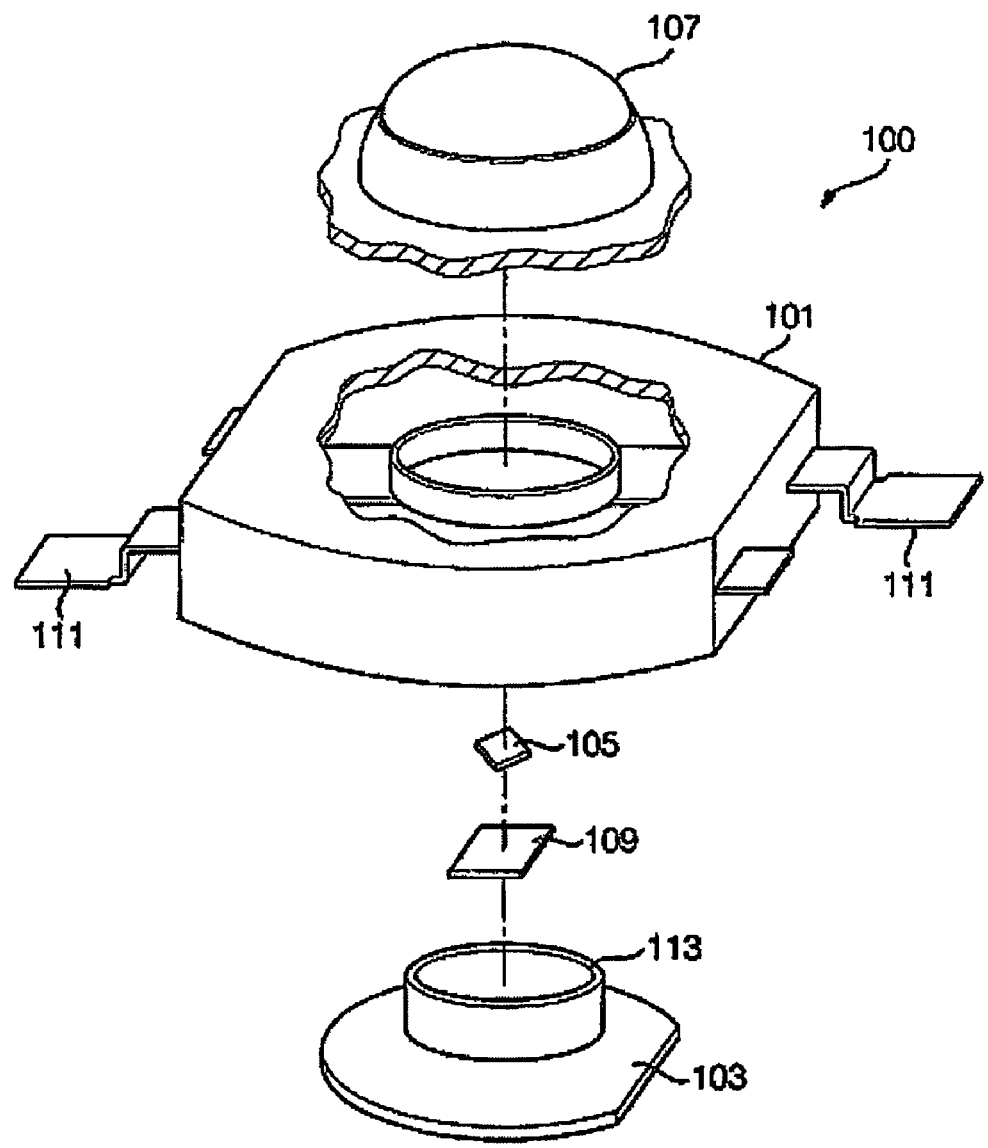
FIG. 1 is a perspective view illustrating the LED package of the prior art.

A LIST OF REFERENCE NUMERALS 1, 31, 71: main body,
3, 35: septum or septa,
5, 51, 111: lead terminals,
7, 7a, 7b, 41, 81, 103: heat sink(s)
9, 43: reflective surfaces,
11, 49: bonding wires,
13, 47a, 47b, 47c, 105: LED die(s),
15, 23, 63, 107: lens,
21, 61, 100: LED package,
33: heat-sink receiving recesses,
37: lead-terminal receiving grooves,
38: heat-sink binding grooves,
39: lead terminal holes,
45: lower portions of heat sinks,
52: inner portions of lead terminals,
54: outer portions of lead terminals,
83: additional heat sink,
85: zener diode,
101: lead frame,
109: submount,
113: reflector cup

BEST MODE FOR CARRYING OUT THE INVENTION

Reference will now be made in detail to preferred embodiments of the present invention, examples of which are illustrated in the accompanying drawings.

First Embodiment

Figure 2:
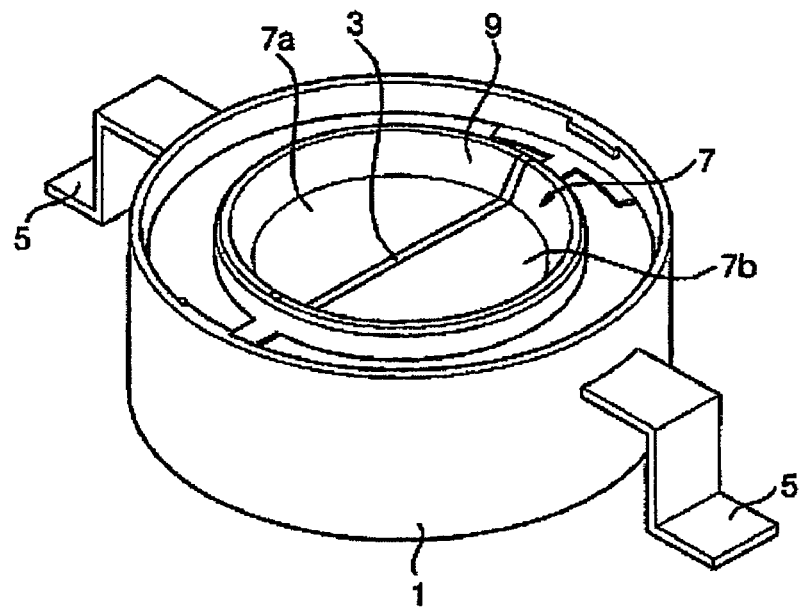
FIG. 2 is a perspective view illustrating the LED package according to a first embodiment of the present invention.
Figure 3:
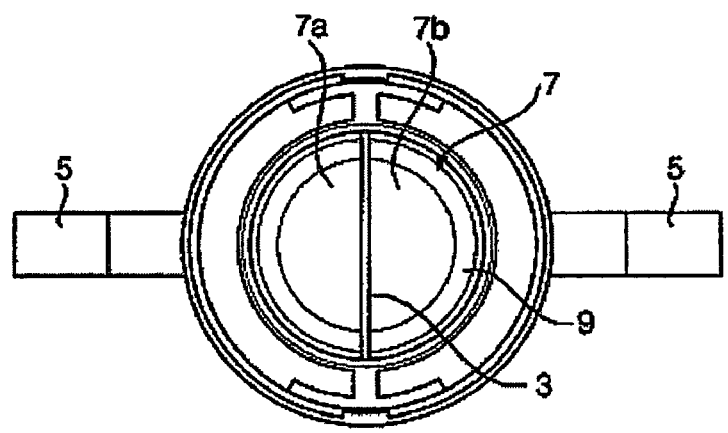
FIG. 3 is a plan view illustrating the LED package of FIG. 2.
Figure 4:
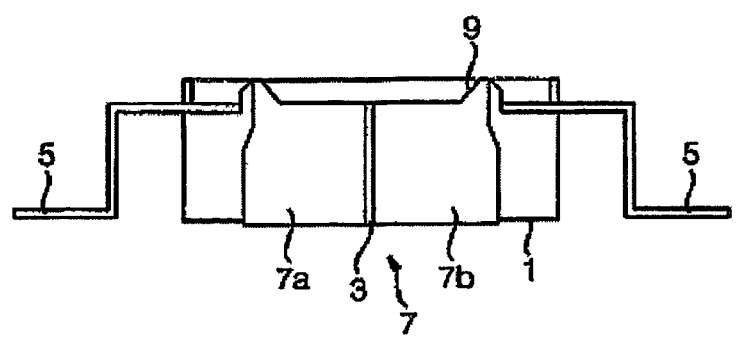
FIG. 4 is a cross sectional view illustrating the LED package of FIG. 2.

FIG. 2 is a perspective view illustrating the LED package according to the first embodiment of the present invention, and FIG. 3 and FIG. 4 are a plan view and a cross sectional view illustrating the LED package of FIG. 2, respectively.

Referring to FIG. 2 to FIG. 4, at least two lead terminals 5 and at least two heat sinks 7 are fixed to a main body 1. The at least two lead terminals 5 comprise a pair of lead terminals 5 electrically coupled to a power source. And the at least two heat sinks 7 may be a pair.

The main body 1 may be formed by injection molding a plastic resin such as poly carbonate (PC), PCABS, PPA, nylon, polyethyleneterephthalate (PET), polybutyleneterephthalate (PBT), or a model. The main body 1 may be formed in a single body along with at least a septum 3 that electrically isolates the at least two heat sinks 7. In addition, the main body 1 may be attached to the lead terminals 5 and the at least two heat sinks 7 using an insert-molding technique.

The at least two heat sinks 7 may be slugs with each heat sink having an upper surface for mounting LED dies. Each of the at least two heat sinks 7 may also have a reflective surface 9 extended from the upper surface thereof. The at least two heat sinks 7 having the reflective surface 9 are appropriately arranged to gather the light emitted from the LED dies efficiently. The at least two heat sinks 7 are formed of electrically and thermally conductive materials. For example, the at least two heat sinks 7 may be formed of copper (Cu), gold, silver (Ag), silicon carbide (SiC) or aluminum (Al). Since each of the at least two heat sinks 7 is conductive, each of the heat sinks 7 may be used as an electrode of the LED die and be electrically connected to the lead terminals 5 through bonding wires. The at least two heat sinks 7 are separated from each other. The at least two heat sinks 7 may be separated by at least a septum 3 formed in a single body along with the main body 1. Although the two heat sinks 7a, 7b separated from each other are shown in FIG. 2 to FIG. 4, there may be more than two heat sinks 7. In addition, the lower surface of each of the heat sinks 7 may have a relatively wide width compared with the upper surface thereof to promote thermal relief.

A pair of the lead terminals 5 is electrically connected to an external power source. Therefore, each of the lead terminals 5 may have a curved shape suitable to be mounted on a printed circuit board (PCB) and others, as shown in FIG. 2 to FIG. 4. Although FIG. 2 to FIG. 4 show a pair of lead terminals 5, additional lead terminals (not shown) may be fixed to the main body 1. The additional lead terminals may be thermally connected to the at least two heat sinks 7 to promote thermal relief. Also, the additional lead terminals may be connected to the printed circuit board and others to support the LED package safely.

Figure 5:
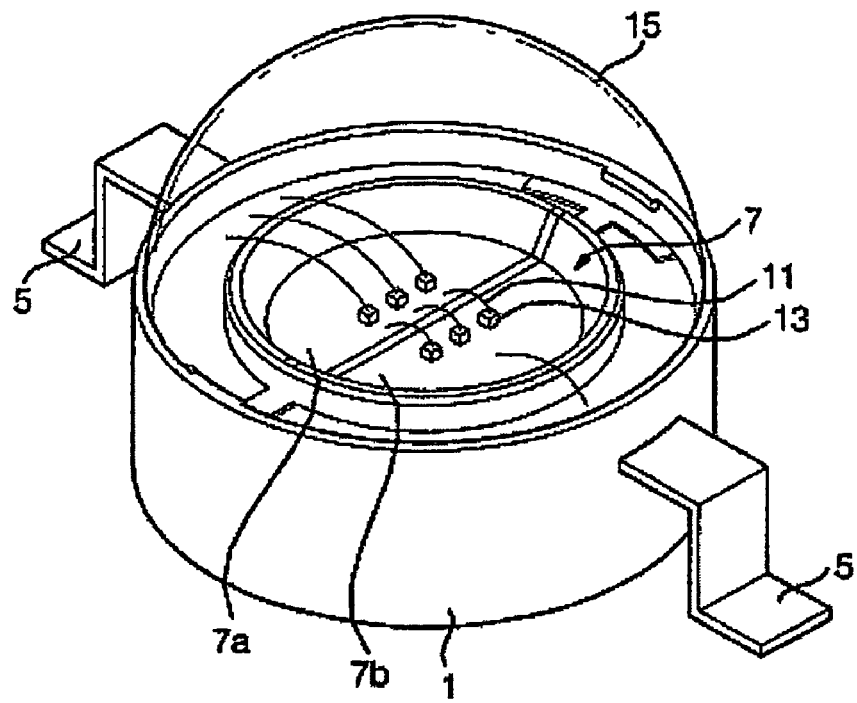
FIG. 5 is a perspective view illustrating the LED package mounting LED dies according to the first embodiment of the present invention.

FIG. 5 is a perspective view illustrating the LED package in which the LED dies are mounted.

Referring to FIG. 5, LED dies 13 are mounted on each of the at least two heat sinks 7a, 7b. Each of the LED dies 13 is electrically and directly connected to the heat sinks 7 via a surface of the LED die. That is, the surface of each of the LED dies 13 is contacted with the upper surface of the heat sink 7 without any submount. The number of the LED dies attached on each of the at least two heat sinks 7 may be varied with a desired purpose. And, various kinds of the LED dies 13 may be selected according to the desired purpose. However, it is preferable that the LED dies 13 having the same structure are mounted in one package to make sure of uniformity of emitted light and simplify fabrication processes of the LED package. Also, the LED dies 13 may be arranged symmetrically with each other to make sure of uniformity of emitted light.

Bonding wires 11 electrically connect the pair of lead terminals 5, the at least two heat sinks 7 and the LED dies 13. Then, each of the LED dies 13 may be electrically connected to at least one of the bonding wires 13 through another surface of the LED die. As a result, each of the LED dies 13 is electrically connected to the at least one bonding wire 11 and the heat sink 7 mounting it. Thus, a power source may be coupled to the pair of lead terminals to supply electric power to the LED dies. Meantime, the LED dies 13 mounted on the same heat sinks 7 are connected in parallel, while the LED dies 13 mounted on different heat sinks 7 respectively are connected in series. As a result, the connection of the LED dies 13 may be constituted in combination with in parallel and series between the pair of the lead terminals. A variety of manners connecting the bonding wires 11 are possible, and it is possible to connect the bonding wires 11 such that the input current driving the LED dies 13 can be decreased relatively.

Meantime, a lens 15 is attached to the main body 1 to enclose the LED dies 13. The lens 15 may have a variety of shapes according to its applications. Further, the lens 15 may include an optically transparent material directly contacted with the LED dies 13. The optically transparent material may be a transparent epoxy or silicone, and contain an additive such as a diffusing material, a fluorescent material and so on. The diffusing material prevents the bonding wires 11 and LED dies 13 from appearing on the outside, while the fluorescent material converts a wavelength of light emitted from the LED dies 13. And the fluorescent material may be distributed directly on the LED dies 13. The desired wavelengths of light are emitted to the outside by appropriately selecting the fluorescent material. For example, the fluorescent material may be a material including at least one element selected from the group consisting of Ca, Sr, Ba and O, and at least one element selected from the group consisting of Al, O and Si, and activated by an element (Eu) of cerium group.

According to the first embodiment of the present invention, the LED package having high luminous power is provided employing at least two heat sinks 7 and mounting a plurality of LED dies 13 in one LED package.

Second Embodiment

Figure 6:
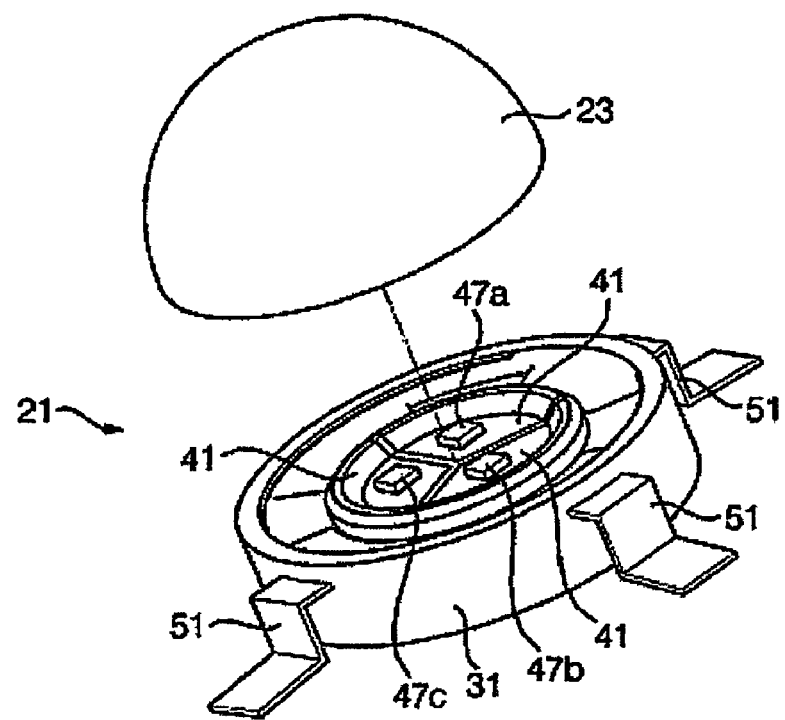
FIG. 6 is a perspective view illustrating the LED package according to a second embodiment of the present invention.
Figure 7:
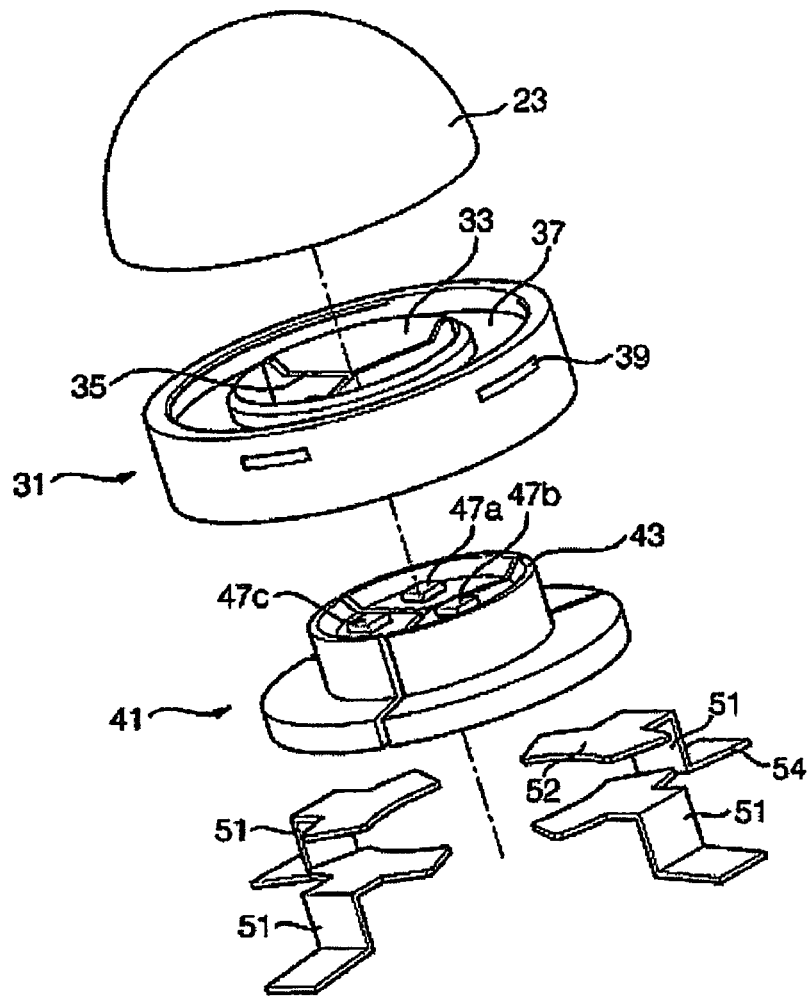
FIG. 7 is an exploded perspective view illustrating the LED package of FIG. 6.
Figure 8:
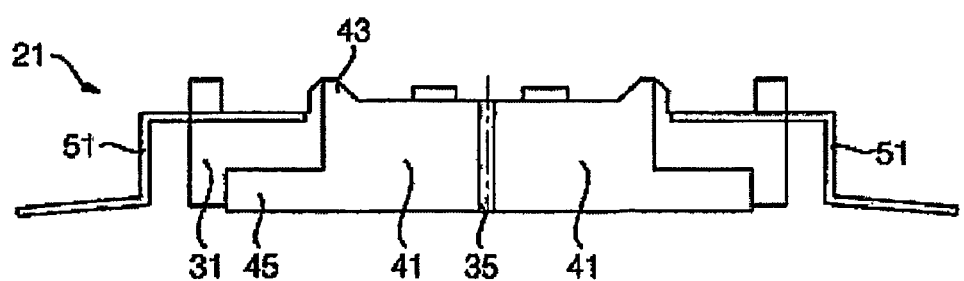
FIG. 8 is a cross sectional view illustrating the LED package of FIG. 6.
Figure 9:
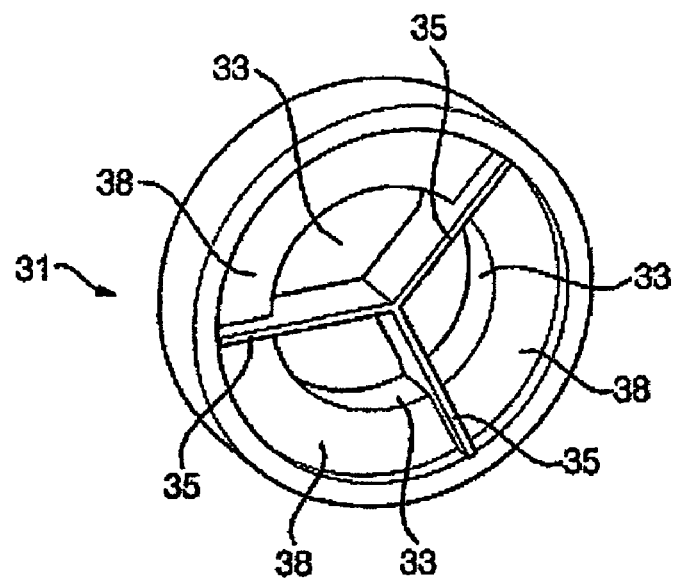
FIG. 9 is a bottom perspective view illustrating a main body of the LED package of FIG. 6.

FIG. 6 is a perspective view illustrating an LED package 21 according to the second embodiment of the present invention. And FIG. 7 and FIG. 8 are an exploded perspective view of FIG. 6 and a cross sectional view of FIG. 6 without a lens, respectively. Also, FIG. 9 is a bottom perspective view illustrating a main body of FIG. 6. In the second embodiment, it is described in detail the LED package 21 having three heat sinks and four lead terminals. However, the numbers of the heat sinks and the lead terminals are not limited by the above. That is, it is possible for the LED package 21 to have two heat sinks and three lead terminals, and also for the LED package 21 to have more than two heat sinks and three lead terminals.

In FIG. 6 to FIG. 9, lead terminals 51 and heat sinks 41 are fixed to a main body 31, as described referring to FIG. 2 to FIG. 4.

The main body 31 may be formed by injection molding a plastic resin, as described referring to FIG. 2 to FIG. 4. The main body 31 is formed in a single body along with septa 35 that electrically isolates the heat sinks 41. In addition, the main body 31 is attached to the lead terminals 51 and the heat sinks 41 using an insert-molding technique. The main body 31 may have heat-sink receiving recesses 33, and the heat-sink receiving recesses 33 may be separated by the septa 35. The receiving recesses 33 may be holes passing through the main body 31, as shown in the drawings.

Lead-terminal receiving grooves 37 may be placed onto an upper surface of the main body 31. The lead-terminal receiving grooves 37 may be arranged along the circumference direction of the main body 31, as shown in the drawings. The lead terminals 51 are mounted to the lead-terminal receiving grooves 37, respectively. Lead terminal holes 39 passing through the side wall of the main body 31 may be connected to the lead-terminal receiving grooves 37, respectively. The lead terminals 51 mounted to the lead-terminal receiving grooves 37 project outside through the lead-terminal holes 39.

As shown in FIG. 9, recessed heat-sink binding grooves 38 are placed onto the lower surface of the main body 31. The heat-sink binding grooves 38 may be arranged along the circumference direction of the main body 31. And, the heat-sink binding grooves 38 may be separated by the septa 35 from each other. Further, the heat-sink binding grooves 38 are connected to the heat-sink receiving recesses 33, respectively.

The heat sinks 41 are bound to the heat-sink binding grooves 38, and exposed toward the upper potion of the main body 31 through the heat-sink receiving recesses 33. In this case, lower portions 45 of the heat sinks 41 are bound to the heat-sink binding grooves 38. As described referring to FIG. 2 to FIG. 4, the heat sinks 41 may be slugs, each of which has upper surface for mounting LED dies 47a, 47b and 47c. Further, each of the heat sinks 41 may have a reflective surface 43 extended from the upper surface thereof, and is formed of an electrically and thermally conductive material, as described referring to FIG. 2 to FIG. 4. The lower surfaces of the heat sinks 41 have relatively wide widths compared with the upper surfaces on which the LED dies 47a, 47b and 47c are mounted, thereby promoting thermal relief. Also, the lower surfaces of the heat sinks 41 may be exposed outside, as shown in FIG. 8, to promote thermal relief. Meantime, as described above, the heat sinks 41 are insert-molded using a molding technique, while forming the main body 31.

Each of the lead terminals 51 includes an inner portion 52 and an outer portion 54. The inner portions 52 of the lead terminals 51 are mounted to the respective lead-terminal receiving grooves 37 of the main body 31, and may have hook shapes so as not to be detached from the main body 31. Compared to the inner portions 52, the outer portions 54 of the lead terminals 51 may have curved shapes suitable to be mounted on a printed circuit board and others. The outer portions 54 of the lead terminals 51 are exposed outside passing through the lead-terminal holes 39 of the main body 31. Meantime, as described above, the lead terminals 51 are insert-molded using a molding technique, while forming the main body 31.

The LED dies 47a, 47b and 47c are mounted on the heat sinks 41. As shown in FIG. 6 to FIG. 8, the LED dies 47a, 47b and 47c may be one by one mounted on the heat sinks 41. However, the number of the LED dies mounted on each of the heat sinks 41 is not limited by the above, and multiple LED dies may be mounted on each of the heat sinks 41. The LED dies 47a, 47b and 47c include LED dies that emit different wavelengths of light from each other. That is, the LED dies 47a, 47b and 47c may include a first group emitting a first wavelength of light, a second group emitting a second wavelength of light and a third group emitting a third wavelength of light. The first, second and third wavelengths may be red, green and blue wavelengths, respectively. In addition, the first, second and third groups may be mounted on the heat sinks 41, respectively. For the convenience of description, the heat sinks 41 on which the first, second and third groups are mounted, are defined as a first heat sink, a second heat sink and a third heat sink, respectively. The LED package embodying polychromatic light using the LED dies 47a, 47b and 47c, is described referring to FIG. 10.

Figure 10:
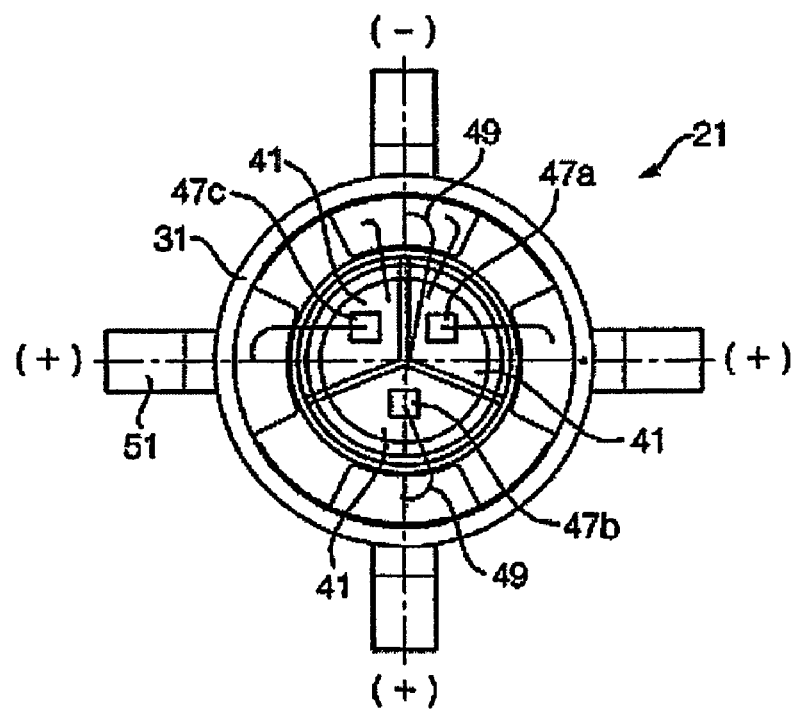
FIG. 10 is a plan view illustrating an LED package according to the second embodiment of the present invention.

FIG. 10 is a plan view illustrating the LED package 21 with bonding wires connected according to the second embodiment of the present invention.

Referring to FIG. 10, the heat sinks 41, the lead terminals 51 and the LED dies 47a, 47b and 47c are connected by bonding wires 49. In this case, the first, second and third heat sinks 41 are electrically connected to the lead terminals 51, respectively. For convenience of description, the lead terminals 51 connected to the first, second and third heat sinks 41 are defined as a first lead terminal, a second lead terminal and a third lead terminal, respectively. Meantime, the lead terminals 51 include a common lead terminal electrically connected to all of the first, second and third heat sinks 41, in addition to the first, second and third lead terminals. More concretely, a negative common lead terminal (−) is connected to the first, second and third heat sinks 41 through the bonding wires 49, while positive lead terminals (+) are connected to the respective LED dies 47a, 47b and 47c through the bonding wires 49, as shown in FIG. 10. Thus, the LED dies mounted on one heat sink may be connected to a power source different from that which is connected to the LED dies mounted on another heat sink. That is, three power sources may be connected between the common lead terminal and each of the first, second and third lead terminals. As a result, polychromatic lights from the LED package 21 may be embodied by controlling ON/OFF of the power sources. For example, when a power source between the first lead terminal and the common lead terminal is turned on, and the other power sources are turned off, the first group of light can be emitted. If the three power sources are turned on, all of the first, second and third groups of light can be emitted to embody white light. Meantime, many colors can be embodied by controlling the amount of electric power supplied to the respective LED dies 47a, 47b and 47c, instead of controlling ON/OFF of the power sources. The amount of electric power supplied to the respective LED dies 47a, 47b and 47c can be controlled by controlling the amount of current or voltage supplied to the respective LED dies. A controller (not shown) may be connected to the LED package 21 to control ON/OFF of the power sources or control the electric power. Meantime, the heat sinks 41, the lead terminals 51 and the LED dies 47a, 47b and 47c can be connected by the bonding wires 49 in various connecting manners.

Turning to FIG. 6 and FIG. 7, a lens 23 is attached to the main body 31 to enclose the LED dies 47a, 47b and 47c, as described referring to FIG. 5. The lens 23 may have various shapes according to its applications, and include a transparent material directly contacted with the LED dies 47a, 47b and 47c, as described referring to FIG. 5.

According to the second embodiment of the present invention, the polychromatic LED package having high luminous power is provided employing the at least two heat sinks 41 and mounting the plurality of LED dies 47a, 47b and 47c which are capable of emitting mutually different wavelengths of light in one LED package.

Third Embodiment

Figure 11:
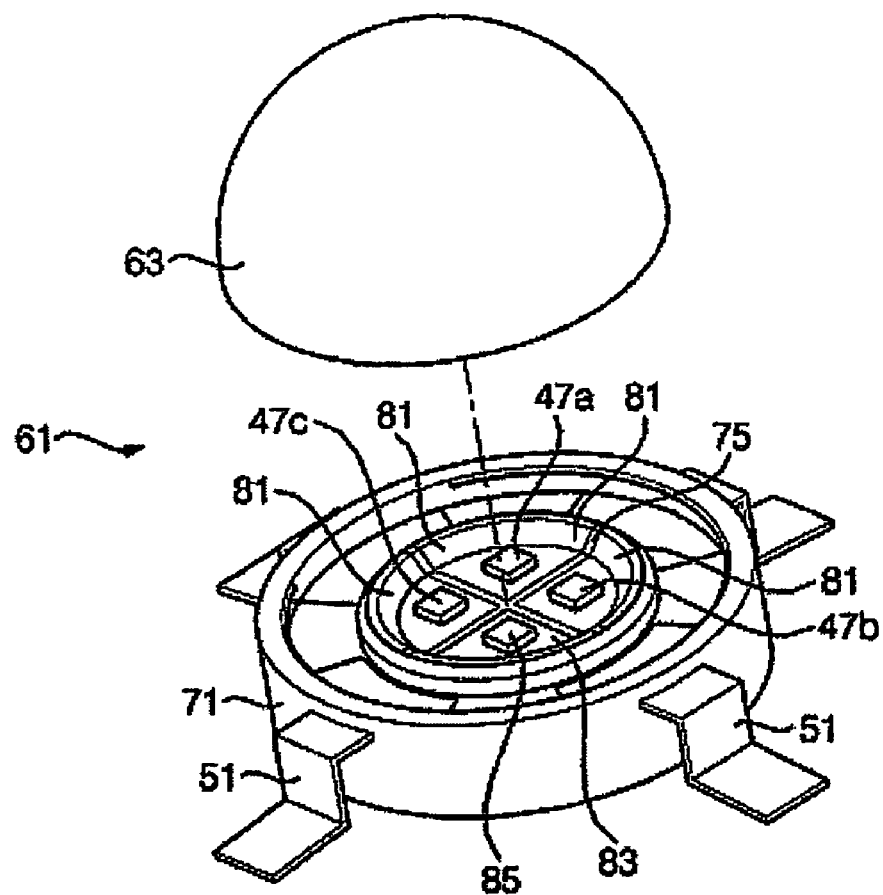
FIG. 11 is a perspective view illustrating an LED package according to a third embodiment according to the present invention.

FIG. 11 is a perspective view illustrating an LED package 61 according to the third embodiment according to the present invention.

Referring to FIG. 11, the lead terminals 51 and heat sinks 81 are fixed to a main body 71, and the LED dies 47a, 47b and 47c are mounted on the heat sinks 81, as described referring to FIG. 6 to FIG. 9. However, the LED package 61 includes an additional heat sink 83, different from the LED package 21 of the second embodiment. Thus, heat-sink receiving recesses, heat-sink binding grooves and septa 75 of the main body 71 are arranged different from those shown in FIG. 6 to FIG. 9. That is, there are provided a receiving recess for receiving the additional heat sink 83 and a binding groove for binding the additional heat sink 83.

A zener diode 85 is mounted on the additional heat sink 83. The zener diode 85 allows the LED package 61 to be maintained in a constant voltage. Meantime, polychromatic lights from the LED package 61 may be embodied by appropriately connecting the lead terminals 51, the heat sinks 81, the LED dies 47a, 47b and 47c, and the zener diode 85 through bonding wires (not shown). As a result, by means of the zener diode

85, it is possible to protect the LED package 61 from static electricity or a sudden change in current, thereby increasing the reliability of the products.

INDUSTRIAL APPLICABILITY

According to the embodiments of the present invention, the LED package having high luminous power is provided employing at least two heat sinks 7 and mounting the plurality of LED dies in one LED package without a submount. Further, by employing heat sinks of electrically conductive materials, there is provided an LED package which can be made by simplified fabrication processes. And further, it is possible to provide an LED package having high luminous power at relatively low input current since the heat sinks are separated from each other and thus the LED dies are connected each other in various connecting manners. Still further, it is possible to provide a high luminous power LED package which embodies polychromatic lights by mounting LED dies emitting different wavelengths of light each other in one LED package.

The invention claimed is:

1. A high power light emitting diode package comprising:
    an insulation main body having an opening to a bottom surface;
    at least two lead terminals fixed to the main body; and
    at least two heat sinks of electrically and thermally conductive metallic materials, the heat sinks being separated from each other and the at least two lead terminals, and fixed to the main body, wherein a lower portion of each of the at least two heat sinks is exposed to the outside of the bottom surface of the main body through the opening of the main body.

2. The package of claim 1, wherein each of the at least two heat sinks has a reflective surface extended from an upper surface thereof.

3. The package of claim 1, wherein the at least two heat sinks are a pair.

4. The package of claim 3, further comprising: at least one light emitting diode die mounted on upper surfaces of the at least two heat sinks, the die being directly and electrically connected to the heat sinks through a surface of the die.

5. The package of claim 4, further comprising: bonding wires electrically connecting the at least two lead terminals, the at least two heat sinks and the at least one light emitting diode die.

6. The package of claim 4, further comprising: a lens attached to the main body, the lens enclosing the at least one light emitting diode die.

7. The package of claim 6, wherein the lens includes an optically transparent material which is directly contacted with the at least one light emitting diode die.

8. The package of claim 4, further comprising: a fluorescent material converting the wavelength of light emitted from the at least one light emitting diode die.

9. The package of claim 1, further comprising:
    light emitting diode dies mounted on the respective heat sinks, the light emitting diode dies emitting different wavelengths of light.

10. The package of claim 9, wherein the at least two lead terminals include: lead terminals electrically connected to the at least two heat sinks respectively; and a common lead terminal electrically connected to all of the at least two heat sinks.

11. The package of claim 10, further comprising: an additional heat sink; and a zener diode mounted on the additional heat sink.

12. The package of claim 9, wherein the light emitting diode dies include light emitting diode dies emitting a first wavelength of light, a second wavelength of light and a third wavelength of light, respectively.

13. The package of claim 12, wherein the first wavelength, the second wavelength and the third wavelength are red wavelength, green wavelength and blue wavelength, respectively.

14. A light emitting diode system comprising:
    the light emitting diode package according to claim 10 or claim 11; and
    a controller for controlling the electric power supplied to the light emitting diode package, wherein the controller controls the amount of the current supplied to the respective heat sinks.

15. The package of claim 1, further comprising at least one septum formed in a single body along with the main body to separate the at least two heat sinks.

16. A high power light emitting diode package comprising:
    an insulation main body;
    at least two lead terminals fixed to the main body;
    at least two heat sinks of electrically and thermally conductive materials, the heat sinks being separated from each other and fixed to the main body, each of the at least two heat sinks having an upper surface and a lower surface, the lower surface of each of the at least two heat sinks being relatively wider than the upper surface of each of the at least two heat sinks; and
    a light emitting diode die mounted on one of the upper surfaces of the heat sinks, the light emitting diode die having a lower surface facing the upper surface of each of the at least two heat sinks,
    wherein the upper surface of each of the at least two heat sinks is wider than the lower surface of the light emitting diode die, so that the light emitting diode die mounted partly on a portion of the heat sink.

17. The package of claim 1, wherein the at least two heat sinks each consist of either copper, gold, silver, or aluminum.

18. The package of claim 16, wherein the at least two heat sinks each consist of either copper, gold, silver, or aluminum.

* * * * *